United States Patent
Han et al.

(10) Patent No.: US 12,323,775 B2
(45) Date of Patent: Jun. 3, 2025

(54) ELECTRONIC DEVICE INCLUDING FLEXIBLE PRINTED CIRCUIT BOARD

(71) Applicant: Samsung Electronics Co., Ltd., Suwon-si (KR)

(72) Inventors: Kwanhee Han, Suwon-si (KR); Byunggun Choi, Suwon-si (KR); Sangmin Ye, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 142 days.

(21) Appl. No.: 17/715,822

(22) Filed: Apr. 7, 2022

(65) Prior Publication Data
US 2022/0329937 A1  Oct. 13, 2022

Related U.S. Application Data

(63) Continuation of application No. PCT/KR2022/004007, filed on Mar. 22, 2022.

(30) Foreign Application Priority Data

Apr. 8, 2021  (KR) .................. 10-2021-0045791

(51) Int. Cl.
*H04R 3/00* (2006.01)
*H04M 1/02* (2006.01)
(Continued)

(52) U.S. Cl.
CPC .............. *H04R 3/00* (2013.01); *H04R 1/028* (2013.01); *H04R 9/06* (2013.01); *H04M 1/0277* (2013.01);
(Continued)

(58) Field of Classification Search
CPC . H04R 3/00; H04R 1/028; H04R 9/06; H04R 2499/11; H04R 1/025; H04R 1/021;
(Continued)

(56) References Cited

U.S. PATENT DOCUMENTS

2005/0205295 A1* 9/2005 Tsuk .................... H05K 1/0233
                                                    174/262
2005/0263793 A1* 12/2005 Cornelius ............ H05K 1/0231
                                                    257/E23.079
(Continued)

FOREIGN PATENT DOCUMENTS

CN        202602735 U  * 12/2012
KR    10-1999-0031007 A     5/1999
(Continued)

OTHER PUBLICATIONS

International Search Report and Written Opinion of the International Searching Authority dated Jul. 4, 2022, in connection with International Application No. PCT/KR2022/004007, 10 pages.

*Primary Examiner* — Carolyn R Edwards
*Assistant Examiner* — Kuassi A Ganmavo

(57) ABSTRACT

According to various embodiments of the disclosure, an electronic device may include a housing, a speaker module disposed inside the housing, a printed circuit board disposed within the housing and including a power transmission line configured to supply power to an electronic component of the electronic device, and a loop line extending from the power transmission line toward the speaker module.

18 Claims, 9 Drawing Sheets

(51) Int. Cl.
 *H04M 1/03* (2006.01)
 *H04R 1/02* (2006.01)
 *H04R 9/06* (2006.01)
 *H05K 1/02* (2006.01)
 *H05K 1/11* (2006.01)
 *H05K 1/14* (2006.01)

(52) U.S. Cl.
 CPC .............. *H04M 1/03* (2013.01); *H04R 1/02* (2013.01); *H04R 1/025* (2013.01); *H04R 2499/11* (2013.01); *H05K 1/0278* (2013.01); *H05K 1/11* (2013.01); *H05K 1/141* (2013.01)

(58) Field of Classification Search
 CPC ........ H05K 1/141; H05K 1/11; H05K 1/0278; H04M 1/0277; H04M 1/03
 See application file for complete search history.

(56) References Cited

U.S. PATENT DOCUMENTS

| | | | | |
|---|---|---|---|---|
| 2007/0120425 | A1* | 5/2007 | Ishida | H05K 3/225 307/147 |
| 2007/0251720 | A1* | 11/2007 | Wright | H05K 1/0224 174/255 |
| 2008/0023844 | A1* | 1/2008 | Choi | H05K 1/0216 257/E23.141 |
| 2009/0283894 | A1* | 11/2009 | Lee | H01L 23/49827 257/691 |
| 2010/0265152 | A1* | 10/2010 | Kwak | H01Q 1/243 343/848 |
| 2011/0149530 | A1* | 6/2011 | Hwang | H05K 1/0263 361/748 |
| 2014/0079265 | A1* | 3/2014 | Ouyang | H04R 1/025 381/332 |
| 2016/0301442 | A1* | 10/2016 | Sohn | H05K 9/0032 |
| 2017/0263567 | A1* | 9/2017 | Moon | G09G 3/2092 |
| 2017/0271253 | A1* | 9/2017 | Huang | H01L 21/4846 |
| 2017/0299661 | A1* | 10/2017 | Mirgorodski | H05K 1/0296 |
| 2017/0303395 | A1 | 10/2017 | Ishida et al. | |
| 2018/0277929 | A1* | 9/2018 | Seo | H01Q 1/241 |
| 2019/0074226 | A1* | 3/2019 | Zhu | H01L 29/66636 |
| 2019/0269009 | A1* | 8/2019 | Park | H05K 1/028 |
| 2019/0341675 | A1* | 11/2019 | Yamagajo | H01Q 1/48 |
| 2020/0245448 | A1* | 7/2020 | Cho | H05K 1/0218 |
| 2020/0329557 | A1* | 10/2020 | Kim | H05K 1/0277 |
| 2021/0298165 | A1 | 9/2021 | Jeon | |

FOREIGN PATENT DOCUMENTS

| | | | |
|---|---|---|---|
| KR | 1020010104845 | A * | 11/2001 |
| KR | 10-0744143 | B1 | 8/2007 |
| KR | 10-2012-0097980 | A | 9/2012 |
| KR | 10-2017-0048575 | A | 5/2017 |
| KR | 10-2017-0105984 | A | 9/2017 |
| KR | 10-2020-0012153 | A | 2/2020 |
| KR | 10-2020-0088048 | A | 7/2020 |

* cited by examiner

ELECTRONIC DEVICE INCLUDING FLEXIBLE PRINTED CIRCUIT BOARD

CROSS-REFERENCE TO RELATED APPLICATIONS

This application is a continuation application, claiming priority under § 365(c), of an International application No. PCT/KR2022/004007, filed on Mar. 22, 2022, which is based on and claims the benefit of a Korean patent application number 10-2021-0045791, filed on Apr. 8, 2021, in the Korean Intellectual Property Office, the disclosures of which are incorporated by reference herein in their entirety.

BACKGROUND

1. Field

Various embodiments of the disclosure relate to an electronic device including a loop line.

2. Description of Related Art

Due to the development of the information and communication technology and semiconductor technology, various functions are being integrated into a single portable electronic device. For example, an electronic device may implement various functions, such as an entertainment function (e.g., a game function), a multimedia function (e.g., a music/video reproduction function), a communication and security function for mobile banking or the like, a schedule management function, and an e-wallet function, in addition to a communication function. Such an electronic device is being miniaturized so that a user can conveniently carry the electronic device.

SUMMARY

Electronic devices are being reduced in size and weight in order to improve portability thereof and users' convenience, and may include components integrated in a small space for high performance. For example, in printed circuit boards, a ground surface may be used as a return current path for high-speed signals. However, when the return current path is located adjacent to another electronic component (e.g., a speaker), noise may be generated from a speaker due to a magnetic field generated in the return current path.

According to various embodiments of the disclosure, it is possible to provide an electronic device capable of reducing speaker noise.

However, the problems to be solved in the disclosure are not limited to the above-mentioned problems, and may be variously expanded without departing from the spirit and scope of the disclosure.

According to various embodiments of the disclosure, an electronic device may include a housing, a speaker module disposed within the housing, and a printed circuit disposed within the housing and including a power transmission line configured to supply power to an electronic component of the electronic device, and a loop line extending from the power transmission line toward the speaker module.

According to various embodiments of the disclosure, an electronic device may include a housing, a speaker module disposed inside the housing, a printed circuit board disposed within the housing and including a first printed circuit board area adjacent to the speaker module, and a second printed circuit board area extending from the first printed circuit board, wherein an electronic component and at least a portion of a power transmission line connected to the electronic component are disposed on the second printed circuit area, and a loop line connected to the power transmission line and located in the first printed circuit board area.

According to various embodiments, an electronic device may include a housing, a speaker module disposed within the housing, a printed circuit board disposed within the housing and including a power transmission line, a flexible printed circuit board connected to the speaker module and the printed circuit board, and a loop line located on the flexible printed circuit board and electrically connected to the power transmission line.

An electronic device according to various embodiments of the disclosure may include a loop line providing a path through which a return current flows. Since the return current is concentrated on the loop line, the magnitude of a magnetic field transmitted to the speaker can be reduced, and noise generated from the speaker can be reduced.

In addition, various effects directly or indirectly identified through this document may be provided.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 10A, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
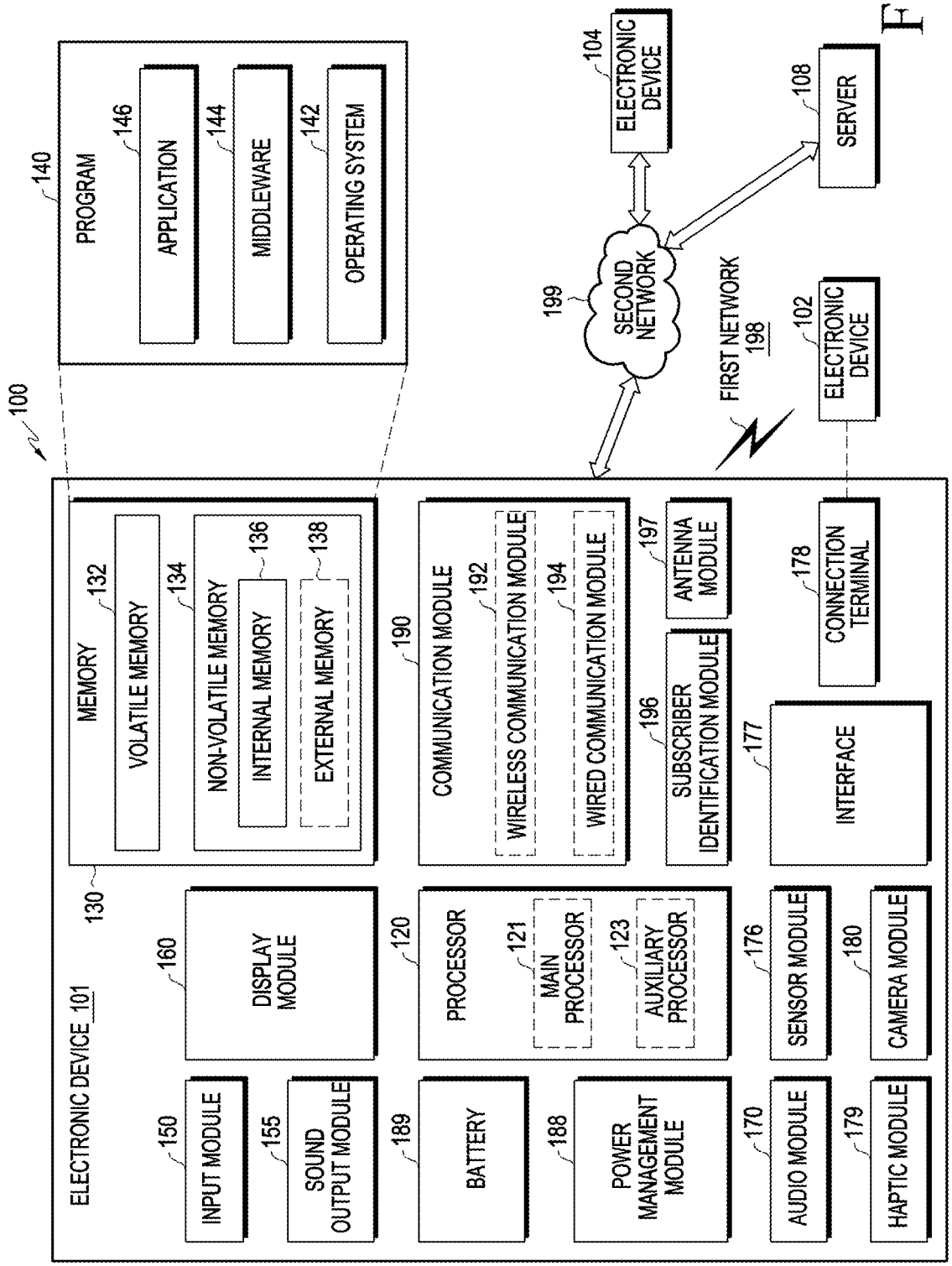
FIG. 1 is a block diagram of an electronic device according to various embodiments of the disclosure in a network environment.

FIG. 1 is a block diagram illustrating an electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
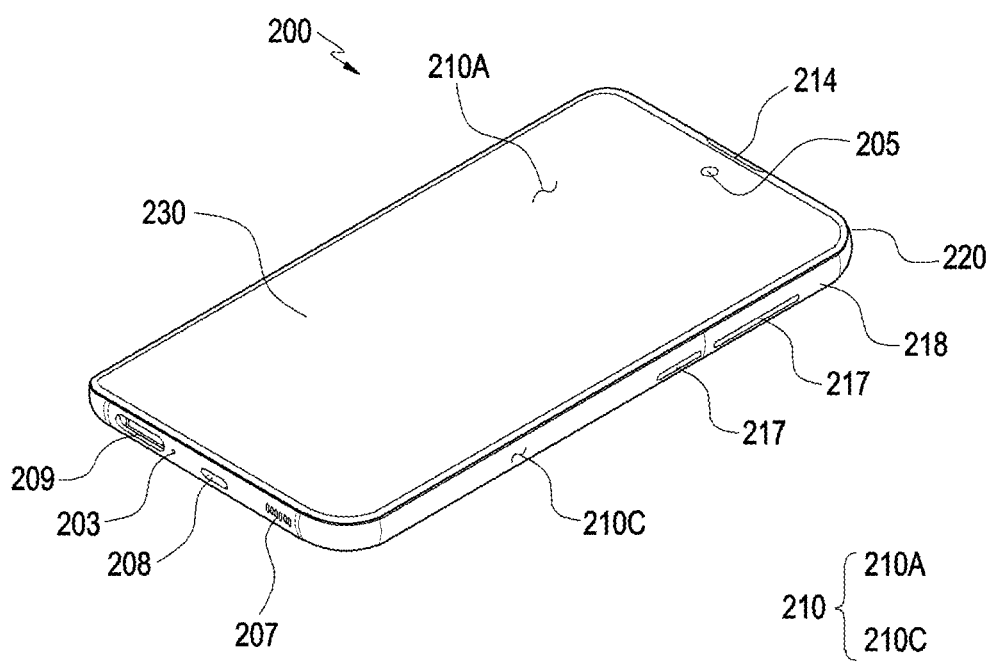
FIG. 2 is a front perspective view illustrating the electronic device according to various embodiments of the disclosure.
Figure 3:
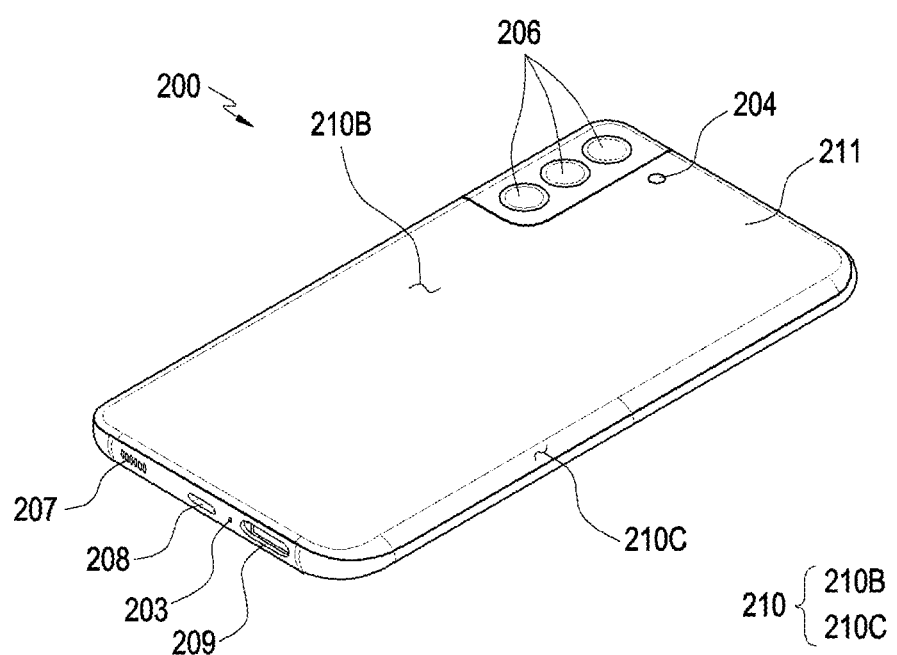
FIG. 3 is a rear perspective view illustrating the electronic device according to various embodiments of the disclosure.

FIG. 2 is a front perspective view illustrating the electronic device according to various embodiments of the disclosure. FIG. 3 is a rear perspective view illustrating the electronic device according to various embodiments of the disclosure.

Referring to FIGS. 2 and 3, an electronic device 200 according to an embodiment may include a housing 210 including a front surface 210A, a rear surface 210B, and a side surface 210C surrounding a space between the front surface 210A and the rear surface 210B. In another embodiment, the housing 210 may refer to a structure defining a part of the front surface 210A in FIG. 2, the rear surface 210B, and the side surface 210C in FIG. 3. According to certain embodiments, at least a portion of the front surface 210A may be formed of a substantially transparent front plate 220 (e.g., a glass plate or a polymer plate including various coating layers). The rear surface 210B may be defined by the rear plate 211. The rear plate 211 may be formed of, for example, glass, ceramic, a polymer, a metal (e.g., aluminum, stainless steel (STS), or magnesium), or a combination of two or more of these materials. The side surface 210C may be provided by a side bezel structure (or a "side member") 218 coupled to the front plate 220 and the rear plate 211 and including a metal and/or a polymer. In some embodiments, the rear plate 211 and the side bezel structure 218 may be integrally configured, and may include the same material (e.g., a metal material or ceramic such as glass or aluminum). According to certain embodiments, the front surface 210A and/or the front plate 220 may be interpreted as a part of the display 230.

According to an embodiment, the electronic device 200 may include at least one of a display 230, audio modules 203, 207, and 214 (e.g., the audio module 170 in FIG. 1), a sensor module (e.g., the sensor module 176 in FIG. 1), camera modules 205 and 206 (e.g., the camera module 180 in FIG. 1), a key input device 217 (e.g., the input module 150 in FIG. 1), and connector holes 208 and 209 (e.g., the connection terminal 178 in FIG. 1). In some embodiments, in the electronic device 200, at least one of the components (e.g., the connector hole 209) may be omitted, or other components may be additionally included. According to certain embodiments, the display 230 may be visually exposed through a substantial portion of, for example, the front plate 220.

According to an embodiment, the surface (or the front plate 220) of the housing 210 may include a screen display area provided as the display 230 is visually exposed. For example, the screen display area may include the front surface 210A.

In another embodiment, the electronic device 200 may include a recess or opening provided in a portion of the screen display area (e.g., the front surface 210A) of the display 230, and may include at least one of an audio module 214, a sensor module, a light-emitting element, and a camera module 205 aligned with the recess or opening. In certain embodiments, the rear surface of the screen display area of the display 230 may include at least one of an audio module 214, a sensor module, a camera module 205, a fingerprint sensor, and a light-emitting element.

In another embodiment, the display 230 may be coupled to or disposed adjacent to a touch-sensitive circuit, a pressure sensor capable of measuring a touch intensity (pressure), and/or a digitizer configured to detect a magnetic field-type stylus pen.

In some embodiments, at least a portion of the key input device 217 may be disposed on the side bezel structure 218.

According to an embodiment, the audio modules 203, 207, and 214 may include a microphone hole 203 and speaker holes 207 and 214. The microphone hole 203 may include a microphone disposed therein to acquire external sound, and in some embodiments, a plurality of microphones may be disposed therein to be able to detect the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker may be included therein without the speaker holes 207 and 214 (e.g., a piezo speaker).

According to an embodiment, the sensor modules may generate an electrical signal or a data value corresponding to, for example, an internal operating state of the electronic device 200 or an external environmental state. The sensor module may include, for example, a first sensor module (e.g., a proximity sensor) and/or a second sensor module (e.g., fingerprint sensor) disposed on the front surface 210A of the housing 210. The sensor module may include a third sensor module (e.g., an HRM sensor) and/or a fourth sensor module (e.g., a fingerprint sensor) disposed on the rear surface 210B of the housing 210. In some embodiments, the fingerprint sensor may be disposed not only on the front surface 210A (e.g., the display 230) of the housing 210, but also on the rear surface 210B. The electronic device 200 may further include at least one of sensor modules, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 205 and 206 may include, for example, a front camera module 205 disposed on the front surface 210A of the electronic device 200, a rear camera module 206 disposed on the rear surface 210B, and/or a flash 204. The camera modules 205 and 206 may include one or more lenses, an image sensor, and/or an image signal processor. The flash 204 may include, for example, a light-emitting diode or a xenon lamp. In some embodiments, two or more lenses (e.g., an infrared camera, a wide-angle lens, and a telephoto lens), and image sensors may be disposed on one surface of the electronic device 200.

According to an embodiment, the key input devices 217 may be disposed on the side surface 210C of the housing 210. In another embodiment, the electronic device 200 may not include some or all of the above-mentioned key input devices 217, and a key input device 217, which is not included in the above-mentioned key input devices, may be implemented in another type, such as a soft key, on the display 230.

According to an embodiment, the light-emitting element may be disposed on, for example, the front surface 210A of the housing 210. The light-emitting element may provide, for example, information about the state of the electronic device 200 in an optical form. In another embodiment, the light-emitting element may provide a light source that is interlocked with, for example, the operation of the front camera module 205. The light-emitting element may include, for example, an LED, an IR LED, and/or a xenon lamp.

According to an embodiment, the connector holes 208 and 209 may include, for example, a first connector hole 208 capable of accommodating a connector (e.g., a USB connector) configured to transmit and/or receive power or an audio signal and/or data to/from an external electronic device, and/or a second connector hole 209 capable of accommodating a storage device (e.g., a subscriber identification module (SIM) card). According to an embodiment, the first connector hole 208 and/or the second connector hole 209 may be omitted.

Figure 4:
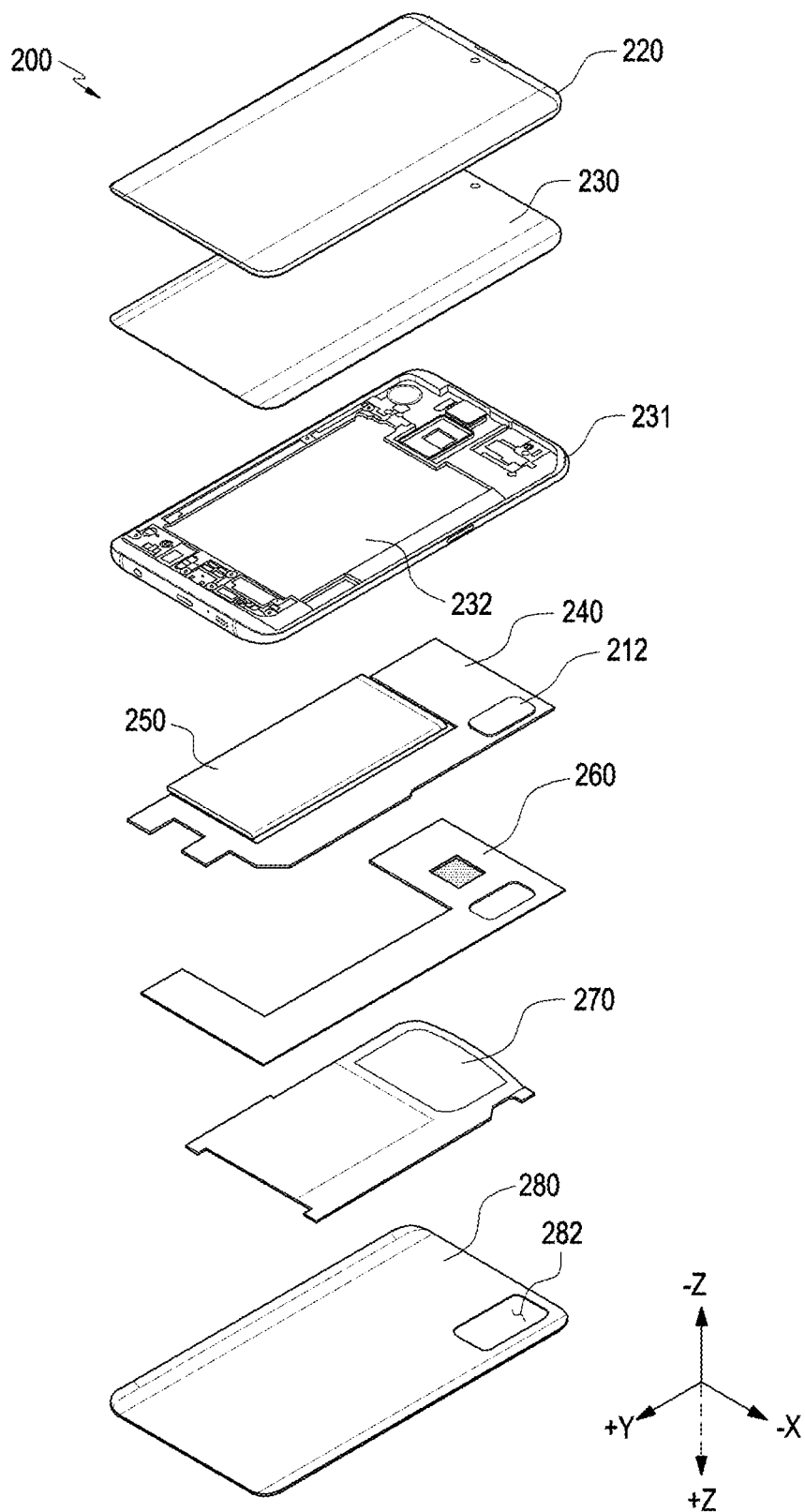
FIG. 4 is an exploded perspective view illustrating the electronic device according to various embodiments of the disclosure.

FIG. 4 is an exploded perspective view illustrating the electronic device according to various embodiments of the disclosure.

Referring to FIG. 4, the electronic device 200 (e.g., the electronic device 200 in FIGS. 2 and 3) may include at least one of a front plate 220 (e.g., the front plate 220 in FIG. 2), a display 230 (e.g., the display 230 in FIG. 2), a first support member 232 (e.g., a bracket), a printed circuit board 240, a battery 250, a second support member 260 (e.g., a rear case), an antenna 270, and a rear plate 280 (e.g., the rear plate 211 in FIG. 3). In some embodiments, in the electronic device 200, at least one of the components (e.g., the first support member 232 or the second support member 260) may be omitted, or other components may be additionally included. At least one of the components of the electronic device 200 may be the same as or similar to at least one of the components of the electronic device 200 of FIG. 2 or FIG. 3, and a redundant description thereof will be omitted below.

According to an embodiment, the first support member 232 may be disposed inside the electronic device 200 so as to be connected to the side bezel structure 231, or may be formed integrally with the side bezel structure 231. The first support member 232 may be formed of, for example, a metal material and/or a non-metal (e.g., polymer) material. The first support member 232 may include one surface to which the display 230 is coupled and the other surface to which the printed circuit board 240 is coupled. A processor, a memory, and/or an interface may be mounted on the printed circuit board 240. The processor may include one or more of, for example, a central processing unit, an application processor, a graphics processor, an image signal processor, a sensor hub processor, or a communication processor. According to an embodiment, the memory may include, for example, a volatile memory or a nonvolatile memory. According to an embodiment, the interface may include, for example, a high-definition multimedia interface (HDMI), a universal serial bus (USB) interface, an SD card interface, and/or an audio interface. The interface may electrically or physically connect, for example, the electronic device 200 to an external electronic device and may include a USB connector, an SD card/an MMC connector, or an audio connector. According to an embodiment, the battery 250 is a device for supplying power to at least one component (e.g., the camera module 212) of the electronic device 200, and may include, for example, a non-rechargeable primary battery, a rechargeable secondary battery, or a fuel cell. At least a portion of the battery 250 may be disposed to be substantially flush with, for example, the printed circuit board 240. The battery 250 may be integrally disposed inside the electronic device 200 or may be detachably disposed on the electronic device 200.

According to various embodiments, the second support member 260 (e.g., the rear case) may be disposed between the printed circuit board 240 and the antenna 270. For example, the second support member 260 may include one surface to which at least one of the printed circuit board 240 or the battery 250 is coupled, and the other surface to which the antenna 270 is coupled.

According to an embodiment, the antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may perform short-range communication with, for example, an external electronic device, or may transmit and/or receive power required for charging to/from the external device in a wireless manner. For example, the antenna 270 may include a coil for wireless charging. In another embodiment, an antenna structure may be configured by the side bezel structure 231 and/or a portion of the first support member 232, or a combination thereof.

According to various embodiments, the electronic device 200 may include a camera module 212 disposed within a housing (e.g., the housing 210 in FIG. 2). According to an embodiment, the camera module 212 may be a rear camera module (e.g., the rear camera module 212 in FIG. 3) disposed on the first support member 232 and is capable of acquiring an image of a subject located at the rear side (e.g., in the +Z direction) of the electronic device 200. According to an embodiment, at least a portion of the camera module 212 may be exposed to the outside of the electronic device 200 through a third opening 282 provided in the rear plate 280.

Although the electronic device 200 illustrated in FIGS. 2 to 4 has a bar type or plate type appearance, the disclosure is not limited thereto. For example, the illustrated electronic device may be a rollable electronic device or a foldable electronic device. The term "rollable electronic device" may mean an electronic device in which bending deformation of a display (e.g., the display 230 in FIG. 4) is possible so that at least a part of the display can be wound or rolled or can be accommodated in the inside of the housing (e.g., the housing 210 in FIG. 2). According to a user's need, a rollable electronic device may be used in the state in which the screen display area is expanded by unfolding the display or exposing a larger area of the display to the outside. A "foldable electronic device" may mean an electronic device in which two different areas can be folded to face each other or to be oriented in directions opposite to each other. In general, in a foldable electronic device in a portable state, the display is folded in the state in which two different areas face each other or in opposite directions, and in actual use, the user may unfold the display such that the two different areas form a substantially flat plate shape. In some embodiments, the electronic device 200 according to various embodiments disclosed herein may be interpreted as including not only a portable electronic device such as a smartphone, but also various other electronic devices such as a notebook computer or a camera.

Figure 5:
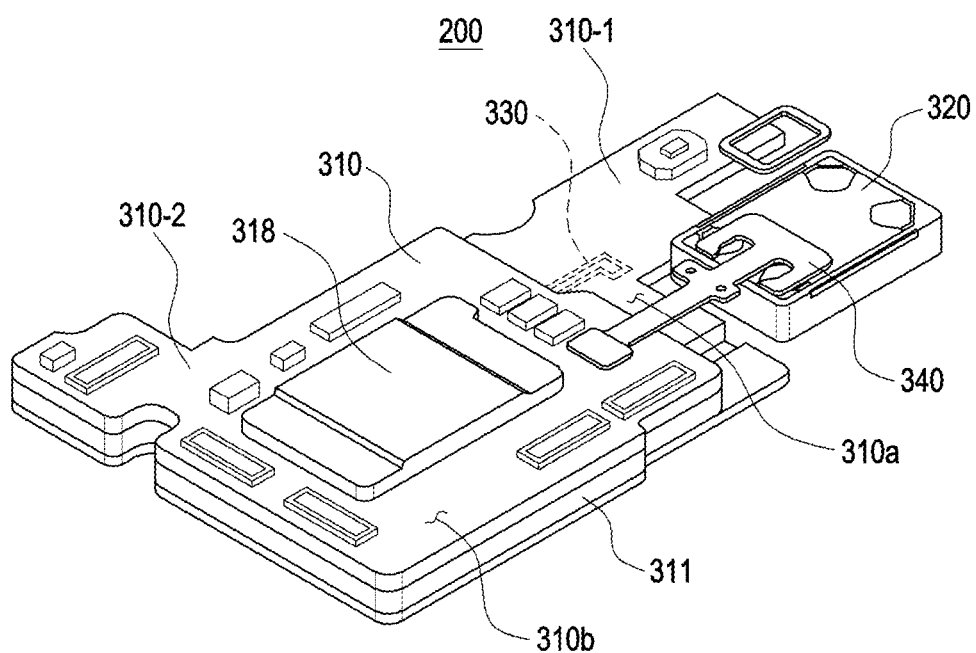
FIG. 5 is a perspective view illustrating a speaker module and a printed circuit board according to various embodiments of the disclosure.
Figure 6:
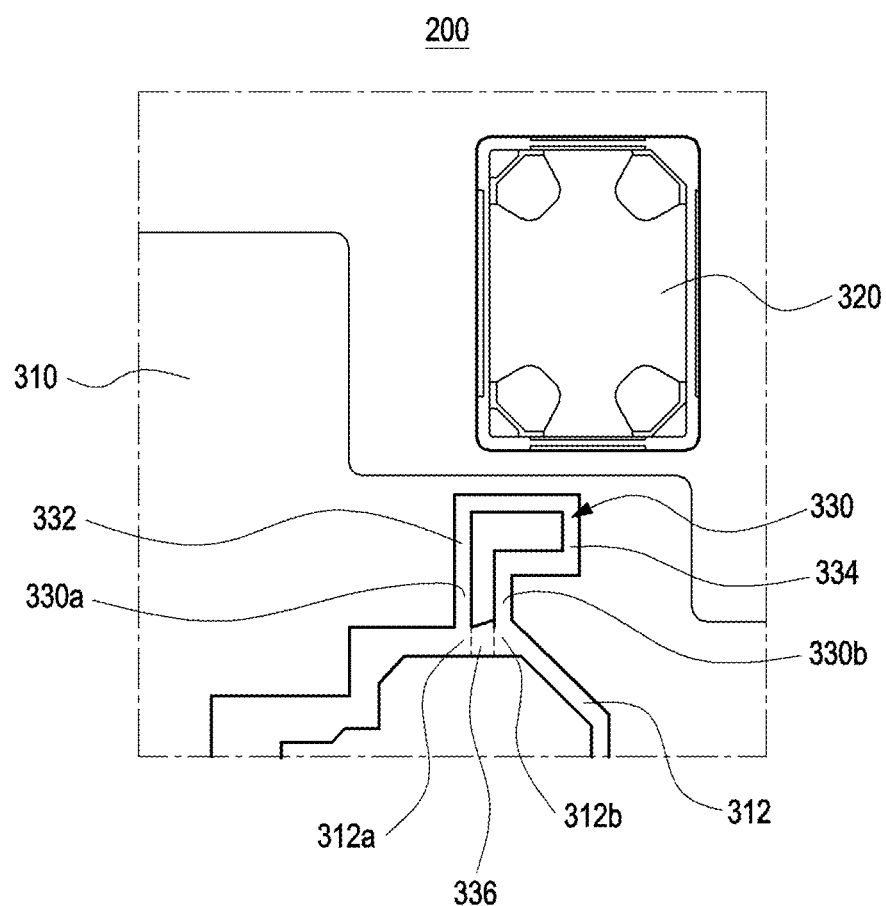
FIG. 6 is a top view illustrating the speaker module and the printed circuit board according to various embodiments of the disclosure.

FIG. 5 is a perspective view illustrating a printed circuit board 310 and a speaker module 320 according to various embodiments of the disclosure. FIG. 6 is a top view illustrating the speaker module and the printed circuit board according to various embodiments of the disclosure.

Referring to FIGS. 5 and 6, the electronic device 200 may include a printed circuit board 310, a speaker module 320, a loop line 330, a printed circuit board 310, and a flexible printed circuit board 340 connected to the speaker module 320. All or part of the configuration of the printed circuit board 310 of FIGS. 5 and 6 may be the same as the configuration of the printed circuit board 240 of FIG. 4, and all or part of the configuration of the speaker module 320 of FIGS. 5 and 6 may be the same as the configuration of the audio module 170 and/or the sound output module 155 of FIG. 1.

According to various embodiments, the printed circuit board 310 may accommodate at least one electronic component 318. For example, the electronic component 318 may be the processor 120 and/or the communication module 190 of FIG. 1. According to an embodiment, the electronic component 318 may be located on the printed circuit board 310. According to an embodiment, the printed circuit board 310 may be disposed with a housing (e.g., the housing 210 in FIG. 2).

According to various embodiments, the printed circuit board 310 may include an interposer 311. According to an embodiment, the printed circuit board 310 may include a first substrate 310-1, a second substrate 310-2, and an interposer 311 disposed between the first substrate 310-1 and the second substrate 310-2. The interposer 311 may surround at least a portion between the first substrate 310-1 and the second substrate 310-2 and may form a shielding space. According to certain embodiments, at least one electronic component 318 may be located in the shielding space. According to certain embodiments, the first substrate 310-1 and/or the second substrate 310-2 may include at least one electric element, a signal line electrically connected to the electric element, and a ground. According to an embodiment, the first substrate 310-1 may be electrically connected to the second substrate 310-2 using the interposer 311. For example, the interposer 311 may include a conductive line (e.g., a via) for electrically interconnecting the first substrate 310-1 and the second substrate 310-2.

According to various embodiments, the printed circuit board 310 may include a power transmission line 312 configured to supply power to the electronic component 318. The power transmission line 312 may be electrically connected to a battery (e.g., the battery 250 in FIG. 3) and the at least one electronic component 318, and the power of the battery 250 may be transmitted to the electronic component 318 using the power transmission line 312. According to an embodiment, the power transmission line 312 may be interpreted as at least one electrical line or conductive path connected to the at least one electronic component 318.

According to various embodiments, the printed circuit board 310 may include a first printed circuit board area 310a adjacent to the speaker module 320 and a second printed circuit board area 310b extending from the first printed circuit board area 310a. For example, the first printed circuit board area 310a may be interpreted as a part of the printed circuit board 310 facing the speaker module 320. According to an embodiment, the first printed circuit board area 310a may be located between the second printed circuit board area 310b and the speaker module 320. The loop line 330 may be connected to the power transmission line 312 and located in the first printed circuit board area 310a. According to an embodiment, the first printed circuit board area 310a may be interpreted as a part of the printed circuit board 310 on which the loop line 330 is located, and the second printed circuit board area 310b maybe interpreted as another part of the printed circuit board 310 in which the electronic component 318 and the power transmission line 312 are located. According to an embodiment, the first printed circuit board area 310a may be interpreted as a part of the first substrate 310-1 in which the loop line 330 is located, and the second printed circuit board area 310b may be interpreted as a part of the second substrate 310-2 in which the electronic component 318 is located and/or a part of the first substrate 310-1 in which the power transmission line 312 is located.

According to various embodiments, the speaker module 320 may convert an electrical signal into sound. For example, the speaker module 320 may include at least one of a vibration plate (e.g., a diaphragm), a coil (e.g., a voice coil) configured to vibrate the diaphragm based on pulse width modulation (PWM), a damping member (e.g., a spring) made of a conductive material and configured to transmit to the coil a signal (e.g., power) transmitted from the outside of the speaker module 320, a magnet, or a conductive plate configured to concentrate a magnetic field generated by the magnet. According to an embodiment, the speaker module 320 may be disposed within a housing (e.g., the housing 210 in FIG. 2). According to an embodiment, the speaker module 320 may be electrically connected to the printed circuit board 310 through the flexible printed circuit board 340.

According to various embodiments, the electronic device 200 may include a loop line 330 connected to the power transmission line 312. According to an embodiment, the loop line 330 may be electrically connected to a battery (e.g., the battery 250 in FIG. 3). For example, at least a part of the power stored in the battery 250 may be transmitted to the loop line 330 via the power transmission line 312. According to an embodiment, the loop line 330 may be integrated with the power transmission line 312. According to another embodiment, the loop line 330 may be a separate line or a conductive material connected to the power transmission line 312.

According to various embodiments, the loop line 330 may extend from the power transmission line 312. For example, the loop line 330 may be a line extending from the power transmission line 312 toward the speaker module 320. According to an embodiment, the loop line 330 may be located on the printed circuit board 310. For example, the printed circuit board 310 may include a plurality of substrates, and the loop line 330 may be disposed on at least one of the plurality of substrates. According to an embodiment, the loop line 330 may be located between the power transmission line 312 and the speaker module 320.

According to various embodiments, the loop line 330 may have a closed curve shape. For example, the loop line 330 may include a first loop line area 332 connected to a first connection portion 312a of the power transmission line 312, a second loop line area 334 connected to the first loop line area 332 and a second connection portion 312b of the power transmission line 312, and a third loop line area 336 extending from the first connection portion 312a to the second connection portion 312b. According to an embodiment, the first loop line area 332 of the loop line 330 may be interpreted as a line extending from the first connection portion 312a, and the second loop line area 334 of the loop line 330 may be interpreted as a line extending from the second connection portion 312b.

According to various embodiments, the loop line 330 may form a closed curve together with the power transmission line 312. According to an embodiment, the third loop line area 336 may be omitted. For example, the loop line 330 may include a first loop line area 332 connected to a first connection portion 312a of the power transmission line 312, and a second loop line area 334 connected to the first loop line area 332 a second connection portion 312b of the power transmission line 312, wherein at least a part of the power transmitted from the first connection portion 312a of the power transmission line 312 to the first loop line area 332 of the loop line 330 may be transmitted to the second connection portion 312b of the power transmission line 312 via the second loop line area 334. According to another embodiment, the third loop line area 336 may be interpreted as a part of the power transmission line 312.

According to an embodiment, at least a portion of the first loop line area 332 may be substantially parallel to at least a portion of the second loop line area 334. According to an embodiment, at least a portion of the third loop line area 336 may be substantially perpendicular to at least a portion of the first loop line area 332 and/or at least a portion of the second loop line area 334.

According to various embodiments, the loop line 330 may form a return current path of a current consumed by a component in an adjacent ground portion due to a proximity effect. For example, when the electronic component 318 operates, at least a part of the current consumed by the component is transmitted to the loop line 330 and a return current flows to the ground adjacent to the loop line 330, whereby the strength of the magnetic field transmitted to the speaker module 320 can be reduced. According to an embodiment, the loop line 330 is a path through which at least a part of power supplied from a battery (e.g., the battery 189 in FIG. 1) flows, and may reduce a return current flowing in a partial area of the printed circuit board 310 adjacent to another electronic component (e.g., the speaker module 320).

According to certain embodiments, the electronic device 200 may include at least one loop line 330. For example, the electronic device 200 may include a plurality of loop lines 330 extending from the power transmission line 312.

Figure 7:
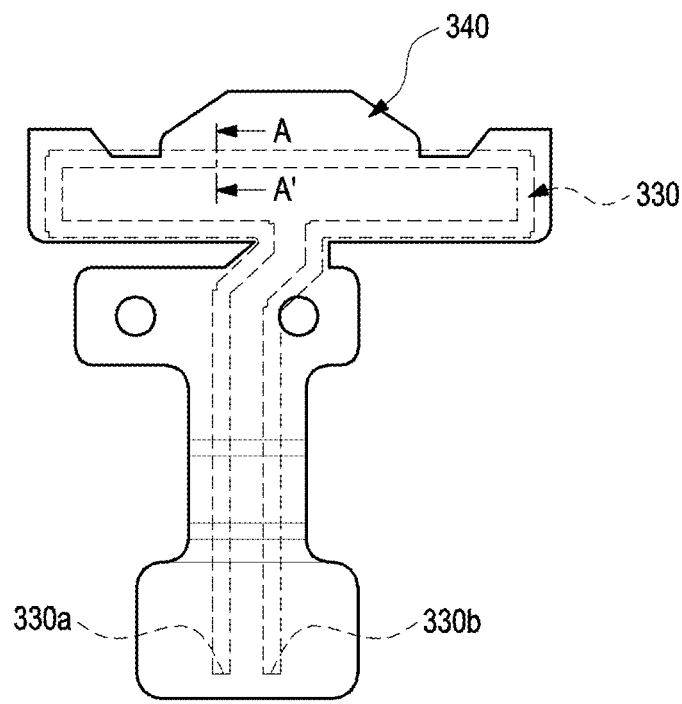
FIG. 7 is a front view of a flexible printed circuit board according to various embodiments of the disclosure.
Figure 8:
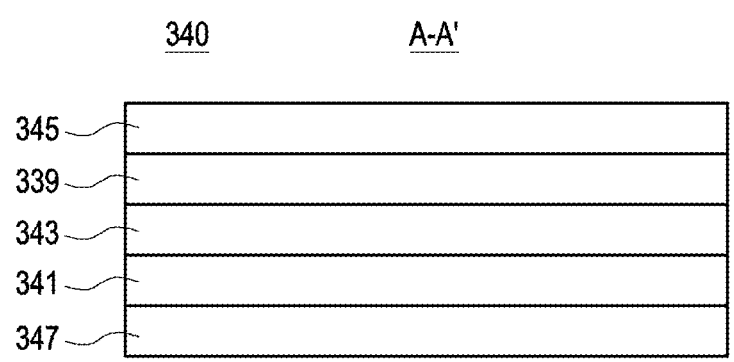
FIG. 8 is a cross-sectional view taken along plane A-A' in FIG. 7.

FIG. 7 is a front view of a flexible printed circuit board according to various embodiments of the disclosure. FIG. 8 is a cross-sectional view taken along plane A-A' in FIG. 7.

Referring to FIGS. 7 and 8, the loop line 330 may be located inside the flexible printed circuit board 340. A part or all the configurations of the loop line 330 and the flexible printed circuit board 340 of FIG. 7 and/or FIG. 8 may be the same as those of the loop line 330 and the flexible printed circuit board 340 of FIG. 5 and/or FIG. 6.

According to various embodiments, the flexible printed circuit board 340 may be connected to a printed circuit board (e.g., the printed circuit board 310 in FIG. 5) and a speaker module (e.g., the speaker module 320 in FIG. 5). According to an embodiment, an audio module (e.g., the audio module 170 in FIG. 1) located on the printed circuit board 310 may transmit an electrical signal to the speaker module 320 via the flexible printed circuit board 340. For example, in the flexible printed circuit board 340, a speaker signal line connected to the speaker module 320 and the printed circuit board 310 may be disposed on the signal line layer 341. According to an embodiment, an audio signal line disposed on the signal line layer 341 may be disposed to at least partially overlap the loop line (e.g., the loop line 330 in FIG. 7) located on the loop line layer 339. According to an embodiment, a partial layer of the flexible printed circuit board 340 in which the loop line 330 is located may be interpreted as a loop line layer 339. According to an embodiment, a speaker signal line disposed on the signal line layer 341 may be connected to an output signal line of the audio module 170 using a connector or soldering, and may supply an output signal of the audio module 170 to the speaker module 320.

According to various embodiments, the loop line 330 may be disposed inside the flexible printed circuit board 340. According to an embodiment, at least a portion of the loop line 330 may be disposed substantially parallel to at least a portion of the signal line layer 341. For example, the loop line 330 may be disposed above or below the signal line layer 341. According to an embodiment, at least a portion of the loop line 330 may overlap at least a portion of a speaker module (e.g., the speaker module 320 in FIG. 5). For example, at least a portion of the loop line 330 may be located on the speaker module 320.

According to various embodiments, the loop line 330 may extend from the power transmission line (e.g., the power transmission line 312 in FIG. 6). According to an embodiment, the loop line 330 may include a first loop line connection portion 330a and a second loop line connection portion 330b opposite to the first loop line connection portion 330a. The first loop line connection portion 330a may be connected to a first connection portion (e.g., the first connection portion 312a in FIG. 6) of the power transmission line (e.g., the power transmission line 312 in FIG. 6), and the second loop line connection portion 330b may be connected to a second connection portion (e.g., the second connection portion 312b in FIG. 6) of the power transmission line 312. According to an embodiment, the first loop line connection portion 330a may be bonded (e.g., soldered) to the first connection portion 312a of the power transmission line 312, and the second loop line connection portion 330b may be bonded to the second connection portion 312b of the power transmission line 312. According to an embodiment, the flexible printed circuit board 340 may include at least one connector connected to the loop line 330, and the flexible printed circuit board 340 may be connected to connection portions 312a and 312b of the power transmission line 312 using the at least one connector. For example, the flexible printed circuit board 340 may include a first connector capable of connecting to the first loop line connection portion 330a and capable of being in contact with the first connection portion 312a, and a second connector capable of connecting to the second loop line connection portion 330b and capable of being in contact with the second connection portion 312b.

According to various embodiments, the flexible printed circuit board 340 may include one or more ground layers 343, 345, and 347. According to an embodiment, the flexible printed circuit board 340 may include a first ground layer 343 disposed between the loop line layer 339 in which the loop line 330 is located and the signal line layer 341. The first ground layer 343 may reduce noise caused to the speaker module (e.g., the speaker module 320 in FIG. 6) due to a magnetic field generated by a current flowing through the loop line 330. According to an embodiment, the flexible printed circuit board 340 may include a second ground layer 345 disposed on the loop line layer 339. The second ground layer 345 may protect the loop line 330. According to an embodiment, the flexible printed circuit board 340 may include a third ground layer 347 disposed under the signal line layer 341. The third ground layer 347 may protect the signal line layer 341. The second ground layer 345 and/or the third ground layer 347 may reduce the transmission of the magnetic field generated by the current flowing through the loop line 330 to the outside of the flexible printed circuit board 340. According to an embodiment, an insulating material may separate the signal line layer 341, the loop line 330, and/or the ground layers 343, 345, and 347 of the flexible printed circuit board 340. For example, the flexible printed circuit board 340 may include one or more insulating layers located between the second ground layer 345 and the loop line 330, between the loop line 330 and the first ground layer 343, between the first ground layer 343 and the signal line layer 341, and/or between the signal line layer 341 and the third ground layer 347.

Figure 9A:
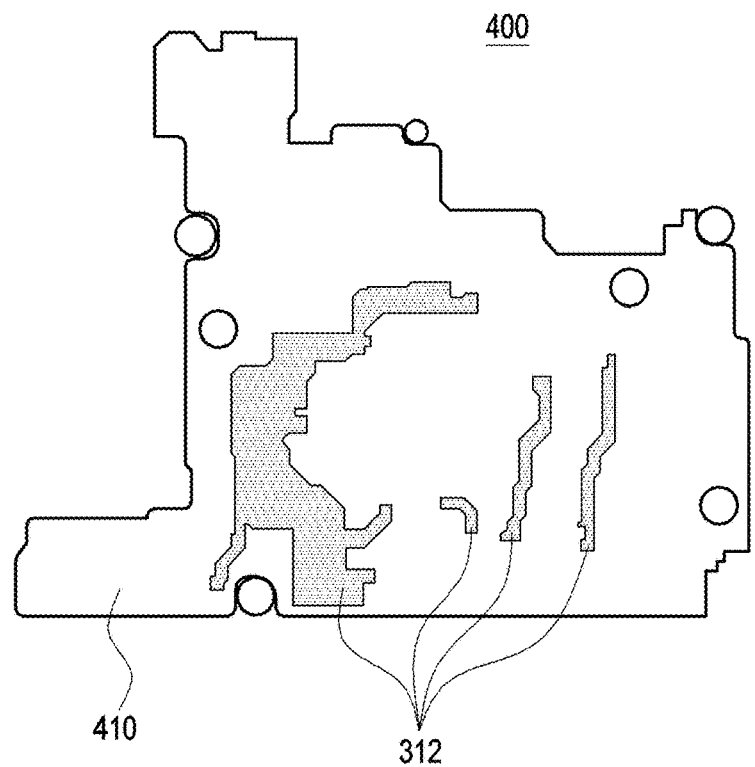
FIG. 9A is a front view of a printed circuit board on which a power transmission line is located according to the related art.
Figure 9B:
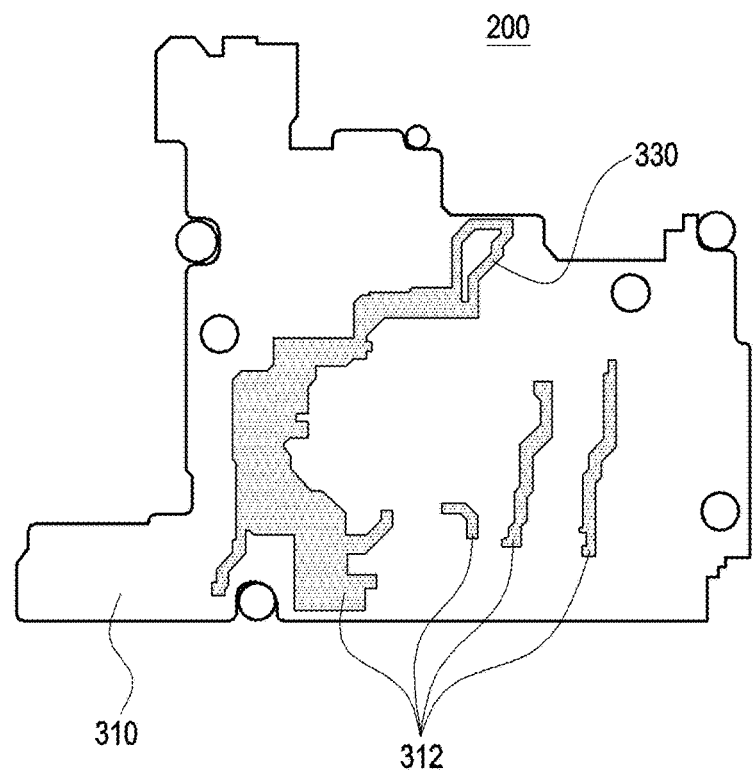
FIG. 9B is a front view of a printed circuit board on which a power transmission line and a loop line according to various embodiments of the disclosure are located.
Figure 10A:
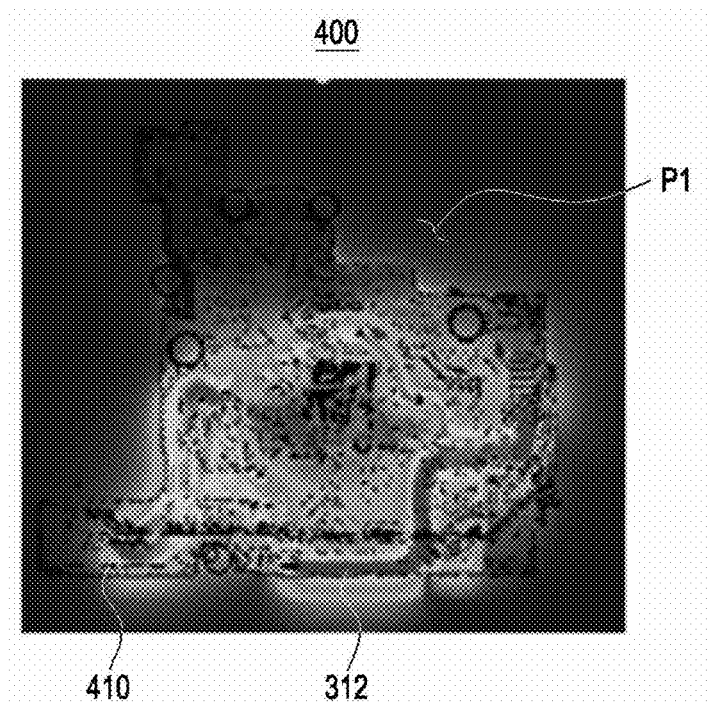
FIG. 10A is a view for describing the magnetic field strength of a printed circuit board according to the related art.
Figure 10B:
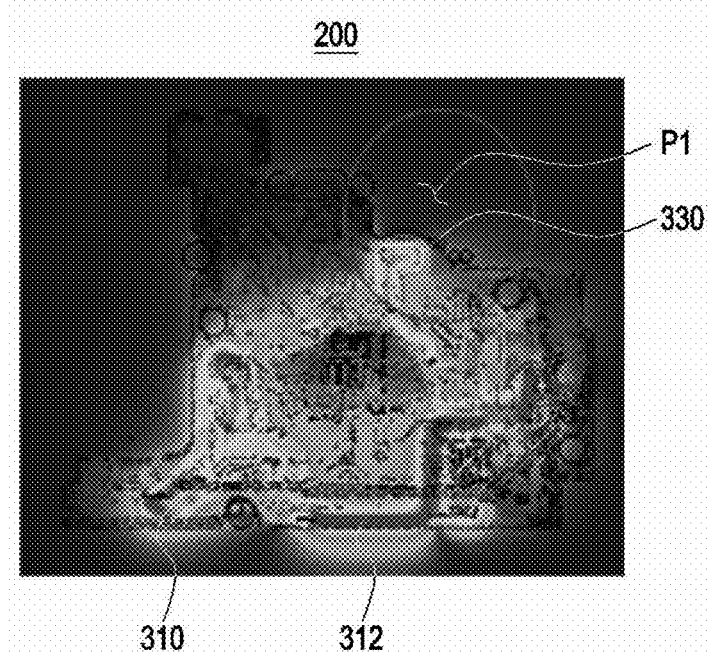
FIG. 10B is a view for describing the magnetic field strength of an electronic device according to various embodiments of the disclosure.

FIG. 9A is a front view of a printed circuit board on which a power transmission line is located according to the related art, and FIG. 9B is a front view of a printed circuit board on which a power transmission line and a loop line according to various embodiments of the disclosure are located. FIG. 10A is a view for describing the magnetic field strength of a printed circuit board according to the related art, and FIG. 10B is a view for describing the magnetic field strength of an electronic device according to various embodiments of the disclosure.

Referring to FIGS. 9A and 9B and FIGS. 10A and 10B, an electronic device 200 may include a printed circuit board 310, a power transmission line 312 located on the printed circuit board 310, and a loop line 330 extending from the power transmission line 312. The loop line 330 may be used as a return current path. All or part of the configurations of the electronic device 200, the printed circuit board 310, the power transmission line 312, and the loop line 330 of FIG. 9B and/or FIG. 10B may be the same as those of the electronic device 200, the printed circuit board 310, the power transmission line 312, and the loop line 330 of FIGS. 5 and 6. The electronic device 400 of FIGS. 9A and 10A may be a conventional electronic device 400. For example, the electronic device 200 of FIG. 9B according to embodiments of the disclosure may be interpreted as an electronic device in which a loop line 330 is added to the electronic device 400 of FIG. 9A.

According to various embodiments, the loop line 330 may reduce the strength of the magnetic field transmitted to the speaker module (e.g., the speaker module 320 in FIG. 5). For example, at the first point P1 at which the speaker module (e.g., the speaker module 320 in FIG. 5) is located, the magnetic field strength of the electronic device 200 (e.g., FIG. 10B) that includes the loop line 330 may be smaller than the magnetic field strength of the conventional electronic device 400 (e.g., FIG. 10A) that does not include the loop line 330. For example, in the electronic device 200 (e.g., FIG. 9B) which includes the loop line 330, at least a part of the return current may flow in the loop line 330, and in the electronic device 400 (e.g., FIG. 9A) that does not include the loop line 330, at least a part of the return current may flow in the printed circuit board 410. According to an embodiment, the magnitude of the magnetic field formed in the loop line 330 may be greater than the magnitude of the magnetic field formed in the printed circuit board 310. For example, the intensity of the return current flowing through the loop line 330 may be greater than the intensity of the return current flowing through a portion of the printed circuit board 310 (e.g., the first printed circuit board area 310a in FIG. 5).

According to an embodiment (e.g., FIGS. 10A and 10B), when the electronic devices 200 and 400 communicate (e.g., wireless fidelity (Wi-Fi) download) with an external electronic device via a first network (e.g., the first network 198 in FIG. 1) using a communication module (e.g., the communication module 190 in FIG. 1), at the first point P1, the magnetic field strength in the electronic device 200 including the loop line 330 may be about 4.3 A/m, and the magnetic field strength of the electronic device 400 not including the loop line 330 may be about 5.1 A/m.

According to an embodiment, when the electronic devices 200 and 400 communicate with an external electronic device using a designated wireless communication method (e.g., global system for mobile communications (GSM)), at the first point (In P1), the magnetic field strength in the electronic device 200 including the loop line 330 may be about 6.0 A/m, and the magnetic field strength in the electronic device 400 not including the loop line 330 may be about 11.2 A/m.

According to various embodiments of the disclosure, an electronic device (e.g., the electronic device 200 in FIG. 2) may include a housing (e.g., the housing 210 in FIG. 2), a speaker module (e.g., the speaker module 320 in FIG. 5) disposed within the housing, a print circuit board (e.g., the printed circuit board 310 in FIG. 5) disposed within the housing and including a power transmission line (e.g., the power transmission line 312 in FIG. 6) configured to supply power to an electronic component (e.g., the electronic component 318 in FIG. 5) of the electronic device, and a loop line (e.g., the loop line 330 in FIG. 6) extending from the power transmission line toward the speaker module.

According to various embodiments, the loop line may be located between the power transmission line and the speaker module.

According to various embodiments, the electronic device may further include a flexible printed circuit board (e.g., the flexible printed circuit board 340 in FIG. 5) connected to the printed circuit board and the speaker module.

According to various embodiments, the loop line may be disposed inside the flexible printed circuit board.

According to various embodiments, at least a portion of the loop line may overlap at least a portion of the speaker module may.

According to various embodiments, the flexible printed circuit board may include a loop line layer (e.g., the loop line layer 339 in FIG. 8) in which the loop line is located, a signal line layer (e.g., the signal line layer 341 in FIG. 8) connected to the speaker module and the printed circuit board, and a first ground layer (e.g., the first ground layer 343 in FIG. 8) disposed between the loop line layer and the signal line layer.

According to various embodiments, the flexible printed circuit board may include a second ground layer (e.g., the second ground layer 345 in FIG. 8) disposed on the loop line layer and a third ground layer (e.g., the third ground layer 347 in FIG. 8) disposed below the signal line layer.

According to various embodiments, the loop line may include a first loop line area connected to a first connection portion (e.g., the first connection portion 312a in FIG. 6) of the power transmission line, a second loop line area (e.g., the second loop line area 334 of FIG. 6) connected to the first loop line area (e.g., the first loop line area 332 in FIG. 6) and a second connection portion (e.g., the second connection portion 312b in FIG. 6) of the power transmission line, and a third loop line area (e.g., the third loop line area 336 in FIG. 6) extending from the first connection portion to the second connection portion.

According to various embodiments, at least a portion of the first loop line area may be substantially parallel to at least a portion of the second loop line area, and at least a portion of the third loop line area may be substantially perpendicular to at least one of at least a portion of the first loop line area and at least a portion of the second loop line area.

According to various embodiments, the loop line may include a first loop line connection portion (e.g., the first loop line connection portion 330a in FIG. 7) connected to the first connection portion (e.g., the first connection portion 312a in FIG. 6) of the power transmission line, and a second loop line connection portion (e.g., the second loop line connection portion 330b in FIG. 7) connected to the second connection portion (e.g., the second connection portion 312b in FIG. 6) of the power transmission line.

According to various embodiments, the speaker module may include a diaphragm and a coil configured to vibrate the diaphragm.

According to various embodiments, the electronic device may further include a battery (e.g., the battery 250 in FIG. 4) electrically connected to the power transmission line and the loop line.

According to various embodiments, the intensity of a return current flowing through the loop line may be greater than the intensity of a return current flowing through a substrate of the printed circuit board.

According to various embodiments of the disclosure, an electronic device (e.g., the electronic device 200 in FIG. 2) may include a housing (e.g., housing 210 in FIG. 2), a speaker module (e.g., the speaker module 320 in FIG. 5) disposed within the housing, a printed circuit board (e.g., the printed circuit board 310 in FIG. 6) disposed within the housing including a first printed circuit board area (e.g., the first printed circuit board area 310a of FIG. 6) adjacent to the speaker module, and a second printed circuit board area (e.g., the second printed circuit board area 310b of FIG. 6) extending from the first printed circuit board area, wherein an electronic component (e.g., the electronic component 318 in FIG. 5) and at least a portion of a power transmission line (e.g., the power transmission line 312) are disposed on the second printed circuit board area, and a loop line (e.g., the loop line 330 in FIG. 6) connected to the power transmission line and located in the first printed circuit board area.

According to various embodiments, the loop line may be formed in a closed curve shape.

According to various embodiments of the disclosure, an electronic device (e.g., the electronic device 200 in FIG. 1) may include a housing (e.g., the housing 210 in FIG. 2), a speaker module (e.g., the speaker module 320 in FIG. 5) disposed within the housing, a printed circuit board (e.g., the printed circuit board 310 in FIG. 6) disposed within the housing and including a power transmission line (e.g., the power transmission line 312 in FIG. 6), a flexible printed circuit board (e.g., the flexible printed circuit board 340 in FIG. 5) connected to the speaker module and the printed circuit board, and a loop line disposed on the flexible printed circuit board and electrically connected to the power transmission line (e.g., the loop line 330 in FIG. 7).

According to various embodiments, the flexible printed circuit board may include a signal line layer (e.g., the signal line layer 341 in FIG. 8) connected to the speaker module and the printed circuit board, and a first ground layer (e.g., the first ground layer 343 in FIG. 8) disposed between the loop line and the signal line layer.

According to various embodiments, at least a portion of the loop line may be disposed on the speaker module.

According to various embodiments, the loop line may include a first loop line area connected to the first connection portion (e.g., the first connection portion 312a in FIG. 6) of the power transmission line, and a second loop line area (e.g., the second loop line area 334 of FIG. 6) connected to the first loop line area (e.g., the first loop line area 332 in FIG. 6) and a second connection portion (e.g., the second connection portion 312b in FIG. 6) of the power transmission line.

According to various embodiments, the electronic device may further include a battery (e.g., the battery 250 in FIG. 4) electrically connected to the power transmission line and the loop line.

It may be apparent to a person ordinarily skilled in the technical field to which the disclosure belongs that the above-described electronic device including a loop line according to the disclosure is not limited by the above-described embodiments and drawings, and can be variously substituted, modified, and changed within the technical scope of the disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a housing;
a speaker module disposed within the housing and including a coil; and
a printed circuit board disposed within the housing, wherein the speaker module is adjacent to the printed circuit board,
wherein the printed circuit board comprises:
a power transmission line configured to supply power to an electronic component of the electronic device;
a loop line extending from the power transmission line toward the speaker module, and connected in parallel to the power transmission line to have a closed shape with the power transmission line; and
a ground including a ground portion adjacent to the loop line, the ground portion configured to form a return current path corresponding to the power transmission line.

2. The electronic device of claim 1, wherein the loop line is located between the power transmission line and the speaker module.

3. The electronic device of claim 1, further comprising:
a flexible printed circuit board connected to the printed circuit board and the speaker module.

4. The electronic device of claim 3, wherein the loop line is disposed inside the flexible printed circuit board.

5. The electronic device of claim 3, wherein at least a portion of the loop line overlaps at least a portion of the speaker module.

6. The electronic device of claim 3, wherein the flexible printed circuit board includes:
a loop line layer on which the loop line is located,
a signal line layer connected to the speaker module and the printed circuit board, and
a first ground layer disposed between the loop line layer and the signal line layer.

7. The electronic device of claim 6, wherein the flexible printed circuit board includes:
a second ground layer disposed on the loop line layer, and
a third ground layer disposed below the signal line layer.

8. The electronic device of claim 1, wherein the loop line includes:
a first loop line area connected to a first connection portion of the power transmission line, a second loop line area connected to the first loop line area and a second connection portion of the power transmission line, and a third loop line area extending from the first connection portion to the second connection portion.

9. The electronic device of claim 8, wherein:
at least a portion of a first loop interconnect area is substantially parallel to at least a portion of a second loop interconnect area, and
at least a portion of the third loop line area is substantially perpendicular to at least one of at least a portion of the first loop line area and at least a portion of the second loop line area.

10. The electronic device of claim 1, wherein the loop line includes:
a first loop line connection portion connected to a first connection portion of the power transmission line, and
a second loop line connection portion connected to a second connection portion of the power transmission line.

11. The electronic device of claim 1, wherein the speaker module includes a diaphragm, wherein the coil is configured to vibrate the diaphragm.

12. The electronic device of claim 1, further comprising:
a battery electrically connected to the power transmission line and the loop line.

13. The electronic device of claim 1:
wherein the printed circuit board comprises:
a first printed circuit board area adjacent to the speaker module; and
a second printed circuit board area extending from the first printed circuit board area, wherein the electronic component and at least a portion of the power transmission line connected to the electronic component are disposed on the second printed circuit board area,
wherein the loop line is located in the first printed circuit board area, and the loop line having a closed shape with the power transmission line.

14. The electronic device of claim 13, wherein the loop line has a closed curve shape.

15. An electronic device comprising:
a housing;
a speaker module disposed within the housing and including a coil;
a printed circuit board disposed within the housing and including a power transmission line configured to supply power to an electronic component of the electronic device; and
a flexible printed circuit board connecting the speaker module and the printed circuit board,
wherein the flexible printed circuit board comprises:
a loop line layer in which a loop line is located, the loop line connected in parallel to the power transmission line to have a closed shape with the power transmission line; and
a first ground layer including a ground portion adjacent to the loop line, the ground portion configured to form a return current path corresponding to the power transmission line.

16. The electronic device of claim 15, wherein the flexible printed circuit board includes a signal line layer connected to the speaker module and the printed circuit board, and wherein the first ground layer is disposed between the loop line and the signal line layer.

17. The electronic device of claim 15, wherein the loop line includes:
a first loop line area connected to a first connection portion of the power transmission line, and
a second loop line area connected to the first loop line area and a second connection portion of the power transmission line.

18. The electronic device of claim 15, further comprising:
a battery electrically connected to the power transmission line and the loop line.

* * * * *